United States Patent
Von Tuerckheim et al.

(10) Patent No.: US 11,670,319 B2
(45) Date of Patent: Jun. 6, 2023

(54) ENHANCING ARTIFICIAL REVERBERATION IN A NOISY ENVIRONMENT VIA NOISE-DEPENDENT COMPRESSION

(71) Applicant: HARMAN BECKER AUTOMOTIVE SYSTEMS GmbH, Karlsbad-Ittersbach (DE)

(72) Inventors: Friedrich Von Tuerckheim, Hamburg (DE); Stefan Finauer, Munich (DE); Adrian Von Dem Knesebeck, Munich (DE); Tobias Muench, Munich (DE)

(73) Assignee: Harman Becker Automotive Systems GMBH, Karlsbad-Ittersbach (DE)

( * ) Notice: Subject to any disclaimer, the term of this patent is extended or adjusted under 35 U.S.C. 154(b) by 20 days.

(21) Appl. No.: 17/412,186

(22) Filed: Aug. 25, 2021

(65) Prior Publication Data
US 2021/0383819 A1   Dec. 9, 2021

Related U.S. Application Data

(63) Continuation of application No. 16/435,388, filed on Jun. 7, 2019, now Pat. No. 11,133,017.

(51) Int. Cl.
*G10L 21/0208*   (2013.01)
*G10L 19/00*   (2013.01)
*B60R 11/02*   (2006.01)
*H03M 7/30*   (2006.01)

(52) U.S. Cl.
CPC ...... *G10L 21/0208* (2013.01); *B60R 11/0217* (2013.01); *G10L 19/00* (2013.01); *H03M 7/3059* (2013.01); *G10L 2021/02082* (2013.01)

(58) Field of Classification Search
CPC .............. G10L 21/0208; G10L 19/00; G10L 2021/02082; B60R 11/0217; H03M 7/3059; H03M 7/6023; G10H 2210/281; G10H 2220/351; G10H 2250/115; G10K 15/08; H04S 7/305
See application file for complete search history.

(56) References Cited

U.S. PATENT DOCUMENTS

| | | | | |
|---|---|---|---|---|
| 2012/0275613 | A1* | 11/2012 | Soulodre | H04S 5/005 381/63 |
| 2016/0112811 | A1* | 4/2016 | Jensen | G10L 21/0232 381/17 |
| 2016/0329061 | A1* | 11/2016 | Heber | G10L 19/167 |

OTHER PUBLICATIONS

Griesinger, D., "Spaciousness and Envelopment in Musical Acoustics", in Audio Engineering Society Convention 101, 1996, 24 pages.

(Continued)

*Primary Examiner* — Yogeshkumar Patel
(74) *Attorney, Agent, or Firm* — Artegis Law Group, LLP (57) ABSTRACT

Techniques for regenerating reverberation include generating a reverberation signal based on a source signal and a response of a listening space, generating a compressed reverberation signal by increasing output levels of a first portion of the reverberation signal having output levels below a threshold level more than output levels of a second portion of the reverberation signal having output levels above the threshold level, and combining the compressed reverberation signal with the source signal to form an output signal for the listening space.

20 Claims, 8 Drawing Sheets

(56) References Cited

OTHER PUBLICATIONS

Griesinger, D.,"Objective Measures of Spaciousness and Envelopment," Audio Engineering Society 16th International Conference on Spatial Sound Reproduction, 1999, 15 pages.

Bitzer et al., "Artificial Reverberation: Comparing Algorithms by Using Binaural Analysis Tools," in Audio Engineering Society Convention 121, 2006, 11 pages.

Bitzer et al., "Artificial Reverberation: Comparing Algorithms by Using Monaural Analysis Tools," in Audio Engineering Society Convention 121, 2006, 13 pages.

Jot et al., "Digital Delay Networks for Designing Artificial Reverberators," in Audio Engineering Society Convention 90, 1991, 17 pages.

Griesinger, D., "Improving Room Acoustics Through Time-Variant Synthetic Reverberation," in Audio Engineering Society Convention 90, 1991, 15 pages.

Schlecht et al., "Reverberation Enhancement Systems with Time-Varying Mixing Matrices," in 59th Int. Audio Engineering Society Conference: Sound Reinforcement Engineering and Technology, 2015, 32 pages.

Türckheim et al., "Virtual Venues—an All-Pass-Based Time-Variant Artificial Reverberation System for Automotive Applications", in Audio Engineering Society, Convention Paper, Presented at the 145th Convention, Oct. 17-20, 7 pages.

Griesinger, D., "Practical Processors and Programs for Digital Reverberation," in 7th Int. AES Conference: Audio in Digital Times, Mar. 21, 1989, pp. 187—195 pages.

Griesinger, D., "Theory and Design of a Consumer Environment Processor," in AES Convention 85, 1988, 17 pages.

Johnson et al., "Design and Evaluation of an Interactive Simulated Reverberant Environment," in Audio Engineering Society Convention 131, Oct. 20-23, 2011, 11 pages.

Griesinger, D., "Spatial Impression and Envelopment in Small Rooms," in AES Convention 103, 1997, 13 pages.

* cited by examiner

ENHANCING ARTIFICIAL REVERBERATION IN A NOISY ENVIRONMENT VIA NOISE-DEPENDENT COMPRESSION

CROSS-REFERENCE TO RELATED APPLICATIONS

The present application is a continuation of United States application titled "ENHANCING ARTIFICIAL REVERBERATION IN A NOISY ENVIRONMENT VIA NOISE-DEPENDENT COMPRESSION," filed on Jun. 7, 2019, and having Ser. No. 16/435,388. The subject matter of this related application is hereby incorporated herein by reference.

BACKGROUND

Field of the Embodiments

Embodiments of the present disclosure relate generally to audio signal processing and, more specifically, to enhancing artificial reverberation in a noisy environment via noise-dependent compression.

Description of the Related Art

Reverberation is the persistence of a sound after the sound is produced. Generally, reverberation is created when a direct audio signal is reflected, causing reflections to build up and then decay as the sound of the direct audio signal is absorbed by the surfaces of objects in the space and decreases in amplitude until reaching zero amplitude. Such objects can include furniture, people, walls, air, and the like. Reverberation is most noticeable when the direct sound output stops, but the reflections continue.

A room impulse response (RIR) is the acoustical response to an impulse of a room, vehicle passenger compartment, or other listening space and of the surfaces of objects disposed therein. The RIR contains all information of the listening space transfer function from a single source location to a single microphone location at a specific point in time. The RIR characteristics for the listening space uniquely differ from those of other rooms or spaces depending on the geometry and internal makeup of that space. For example, large halls show longer reverberation tails than small rooms, and are generally considered to have better acoustical characteristics than smaller listening spaces, such as rooms within a dwelling or a vehicle interior.

To improve the acoustics of a listening space, artificial reverberation can be implemented via a sound reinforcement system, which modifies the source signal by adding synthetic room information. A source signal can be an audio file from an arbitrary media source or a microphone signal. When the modified signal is played back, the listener has the impression that the source signal is being played back in a room that is characterized by the added synthetic room information. As an example, a listener in an acoustically dry listening space, such as a vehicle interior, can have a listening experience akin to sitting in a concert hall or any other listening space.

One drawback to artificial reverberation is that, if a significant ambient noise signal is present, then the low-level parts of the RIR can be masked. For example, the late reverberation components that are most responsible for widening the acoustical space cannot be heard by the listener, the perceived spatial envelopment effect is decreased or masked entirely, and the listener has a "drier" listening experience. For example, artificial reverberation in a car can be masked by a small amount of broadband noise from such common sources as the engine, wind, the air conditioning fan, etc. In another example, such masking noise may include background noise like the voices of an audience or street sounds entering the listening space through an open window.

In light of the above, more effective techniques for implementing artificial reverberation in a noisy environment would be useful.

SUMMARY

The various embodiments set forth a system and methods for enhancing artificial reverberation in a noisy environment via noise-dependent compression. The system includes a sensor configured to generate a signal indicating a current noise level in a listening space, a loudspeaker configured to output sound in the listening space based on an output signal, and at least one processor. The at least one processor is configured to execute instructions to: generate an artificial reverberation signal based on a source signal and a response of a listening space, wherein the artificial reverberation signal includes a first low output-level portion having output levels that are below a compression threshold level and a first high output-level portion having output levels that are above the compression threshold level; generate a compressed artificial reverberation signal based on the artificial reverberation signal by increasing the output levels of the low output-level portion by a first magnitude and increasing the output levels of the high output-level portion by less than the first magnitude; and combine the compressed artificial reverberation signal with the source signal to form an output signal for the listening space.

At least one advantage of the disclosed embodiments is that a listener in an acoustically dry listening space can have an acoustical experience akin to sitting in a different listening space, such as a concert hall or other widened listening space, even in the presence of significant noise that would normally mask artificial reverberation.

BRIEF DESCRIPTION OF THE SEVERAL VIEWS OF THE DRAWINGS

So that the manner in which the above recited features of the one or more embodiments can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
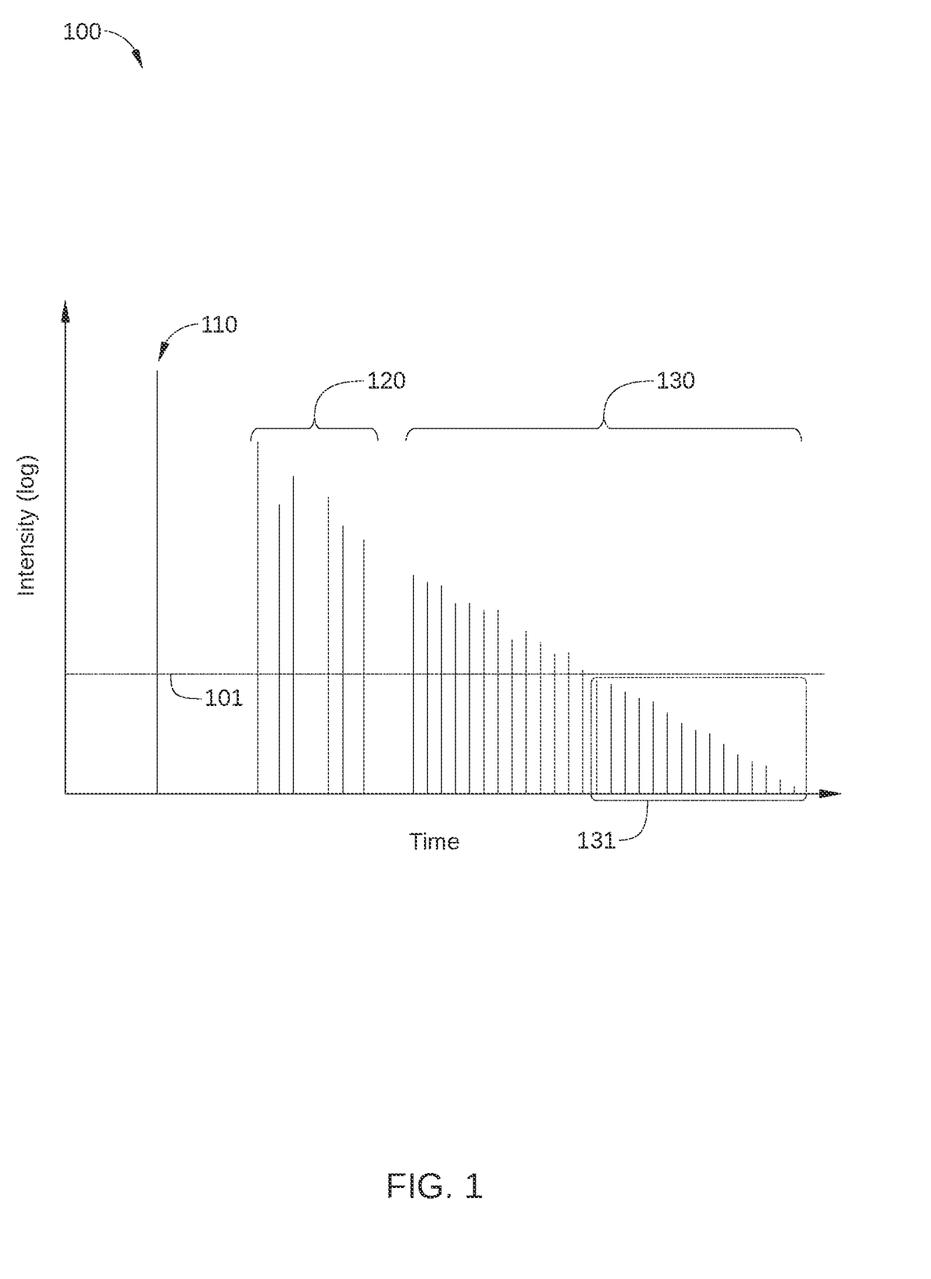
FIG. 1 is a schematic diagram illustrating a room impulse response.

FIG. 1 is a schematic diagram illustrating a room impulse response (RIR) 100. RIR 100 depicts the acoustical response to an impulse of a specific listening space (not shown). Specifically, RIR 100 illustrates sound intensity with respect to time at a certain point in the listening space. As such, RIR 100 includes the sound intensity of a direct sound 110 of the impulse, multiple early reflections 120 of the impulse, and a plurality of late reverberations 130 of the impulse. Together, early reflections 120 and late reverberations 130 make up the total reverberations of the impulse. Early reflections 120 include discrete echoes that are characterized by the shape of the room and the positions of the sound source and the listener, and generally occur in the first 50 to 80 milliseconds (ms) of the impulse response. By contrast, late reverberations 130 include the remaining portion of the impulse response (the "reverberation tail"), and depend on the physical geometry and characteristics of the listening space itself, independent of the source and receiver locations.

It is generally accepted that the optimal room acoustic parameters for a listening space differ depending on the type of venue. For example, concert halls benefit from certain characteristics for an optimum transportation of musical signals, such as reverberation time, lateral energy, early reflection patterns, and the like. Alternatively, for theaters and lecture halls, speech intelligibility is the primary goal, and different acoustic characteristics are typically valued in such venues. However, in most listening spaces, a listener's perception of the spatiality benefits when the listening space has certain spaciousness and envelopment attributes, including late lateral energy and running reverberance among others. Early lateral reflections with delays from 10 ms to 100 ms can decrease the perceived spaciousness of a listening space due to the separation process. Running reverberance describes how loud a rear wall reflection should be to support the perceived envelopment. These, among others, are objective measures for spaciousness and envelopment that enable the room impulse response (RIR) of a listening space to be modified via artificial reverberation. That is, the addition of suitable artificial reverberation to a source signal modifies the RIR 100 of the listening space and therefore can significantly improve a listening experience, e.g. in a small, and therefore dry, listening space.

As shown in FIG. 1, late reverberations 130 are characterized by low amplitude sound signals, and therefore can be masked by the presence of noise in the listening space. For example, given a background noise level 101 in the listening space, a masked portion 131 of late reverberations 130 cannot be heard by a listener. As a result, the perceived spatial envelopment effect created by artificial reverberation is decreased or masked entirely, and the listening has a dryer listening experience. According to various embodiments, a compressor module compresses an artificial reverberation portion of an output signal, so that the artificial late reverberations 130 that are added to a source signal are increased in output level. As a result, the perceived spatiality of the listening space remains stable to the listener when noise is present in the listening space.

Figure 2:
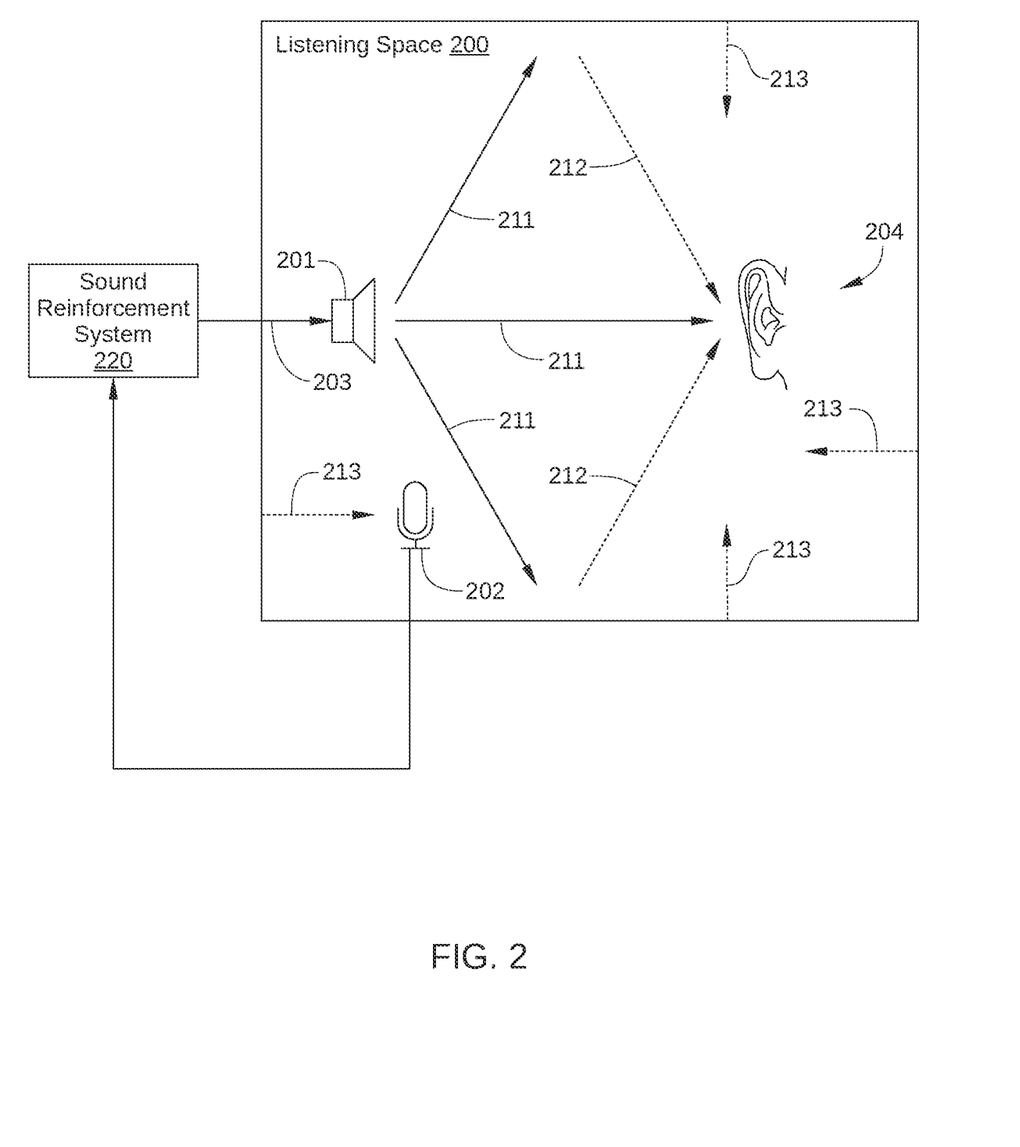
FIG. 2 is a schematic diagram illustrating a listening space, configured to implement one or more aspects of the present disclosure.

FIG. 2 is a schematic diagram illustrating a listening space 200, configured to implement one or more aspects of the present disclosure. Listening space 200 is a listening venue configured with one or more loudspeakers 201 and a sound reinforcement system 220, such as a theatre, a concert hall, a lecture hall, a room within a dwelling, a vehicle interior, and the like. Thus, sound reinforcement system 220 can be integrated into a home entertainment system, a sound system in a large auditorium, an infotainment system of a vehicle, etc. In some embodiments, listening space 200 is further configured with one or more microphones 202.

Sound reinforcement system 220 is configured to generate an output signal 203 that causes the one or more loudspeakers 201 to produce an audio signal 211 that is audible to a listener 204. Output signal 203 includes a source signal with specific audio content (for example, music or sound that is captured by a microphone 202) and an artificial reverberation signal. Thus, when listener 204 hears audio signal 211, early reflections 212 of audio signal 211, and the natural reverberations (not shown) of listening space 200, listener 204 perceives a different spatiality of listening space 200 than the actual spatiality of listening space 200. For example, the artificial reverberation signal included in output signal 203 can cause the spatiality of listening space 200 to substantially synthesize or otherwise reproduce the effect of listening to the audio content of output signal 203 in a large concert hall or other listening venue that has superior acoustic properties. For example, when listening space 200 is a small, dry, listening space, the listening experience of listener 204 is enhanced. Alternatively, it is also possible to modify the characteristics of a larger listening space, such as a theatre or concert hall, by introducing artificial reverberation like early reflections and late reverberation. In this way, the perceived spatiality in larger rooms can be stabilized. In the embodiment illustrated in FIG. 2, a single loudspeaker 201 and a single microphone 202 are shown. In other embodiments, modifying the perceived spatiality of a listening space is more readily achieved via multiple microphones 202 and a sufficient number of speakers.

In many instances, an audio noise signal 213 is also present within listening space 200. Audio noise signal 213 can be generated by one or more noise sources that can substantially or completely mask the artificial reverberation signal included in output signal 203. For example, when listening space 200 is an interior compartment of a vehicle, such as a car, aircraft, watercraft, and the like, noise sources for audio noise signal 213 can include the engine of the vehicle, wind external to the vehicle, an air conditioning fan, wheel interactions with the road surface, etc. When listening space 200 is a concert hall or other listening venue, noise sources for audio noise signal 213 can include the audience, air conditioning equipment serving the listening venue, and other background noise. According to various embodiments, when there is a significant audio noise signal 213 present within listening space 200, sound reinforcement system 220 is configured to modify the artificial reverberation signal included in output signal 203. One embodiment of sound reinforcement system 220 is described below in conjunction with FIG. 3.

Figure 3:
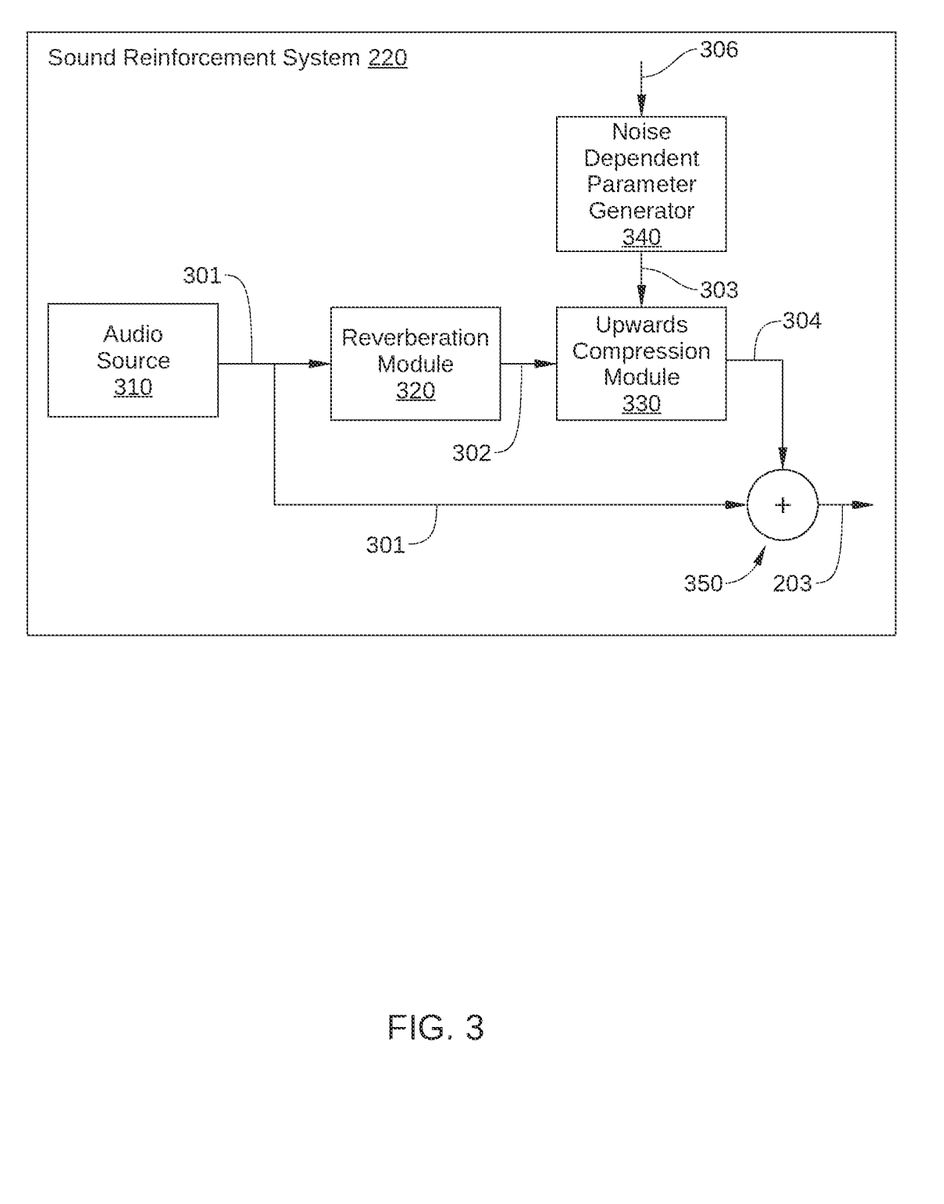
FIG. 3 is a schematic diagram illustrating the sound reinforcement system in the listening space of FIG. 2, according to one embodiment of the present disclosure.

FIG. 3 is a schematic diagram illustrating sound reinforcement system 220, according to one embodiment of the present disclosure. In the embodiment illustrated in FIG. 3, sound reinforcement system 220 modifies an artificially reverberated signal 302 with an upward compression scheme, so that an audio noise signal 213 present within listening space 200 does not mask artificially reverberated signal 302. As such, sound reinforcement system 220 includes an audio source 310, a reverberation module 320, an upwards compression module 330, a noise dependent parameter generator 340, and a signal combiner 350.

Audio source 310 is a source for a source signal 301, which can be a music signal, an audio track associated with a video being viewed in listening space 200, a voice recording, sound recorded in the listening space 200 captured by a microphone 202, and the like. In some embodiments, audio source 310 includes a streaming connection to a music or audio database. Alternatively or additionally, in some embodiments, audio source 310 includes a connection to a radio or any other broadcast media source. Alternatively or additionally, in some embodiments, audio source 310 includes music or other audio files stored locally proximate listening space 200 of FIG. 2. Source signal 301 can be a single signal or multiple signals. In addition, the single signal and/or each of the multiple signals included in source signal 301 can be a mono signal, a stereo signal, or a multi-channel signal.

Reverberation module 320 receives source signal 301 and generates an artificially reverberated signal 302 that is based on source signal 301 and on the reverberation attributes of an artificial room or a measured room. More specifically, reverberation module 320 generates artificial reverberation signal 302 to enhance the listening experience of listener 204 in listening space 200 of FIG. 2. Artificially reverberated signal 302 can be a single signal or multiple signals. In addition, the single signal and/or each of the multiple signals included in artificially reverberated signal 302 can be a mono signal, a stereo signal, or a multi-channel signal.

Reverberation module 320 can generate artificial reverberation signal 302 based on any technically feasible reverberation algorithm or scheme. In some embodiments, reverberation module 320 generates artificially reverberated signal 302 based on previously collected reverberation information that is specific to listening space 200. In some embodiments, reverberation module 320 includes one or more sub-modules (not shown) for generating artificially reverberated signal 302, such as a digital filter module, a reverberation filter network, a delay module, and the like. Alternatively or additionally, reverberation module 322 can include any other suitable signal processing modules for generating artificially reverberated signal 302.

In general, reverberation module 320 may be any technically feasible processing unit capable of executing instructions to enable the functionality described herein. In some embodiments, reverberation module 320 is implemented as a general-purpose processor that can run a suitable software application, such as a central processing unit (CPU). In some embodiments, reverberation module 320 is implemented as a dedicated processing unit, such as an application-specific integrated circuit (ASIC), a field programmable gate array (FPGA), any other type of processing unit, or a combination of different processing units.

Upwards compression module 330 is configured to generate a compressed artificial reverberation signal 304 based on artificially reverberated signal 302 and, in some embodiments, on one or more noise-dependent parameters 303. More specifically, upwards compression module 330 performs an upward compression operation on artificially reverberated signal 302. The result of one such upward compression operation is described below in conjunction with FIG. 4.

Figure 4:
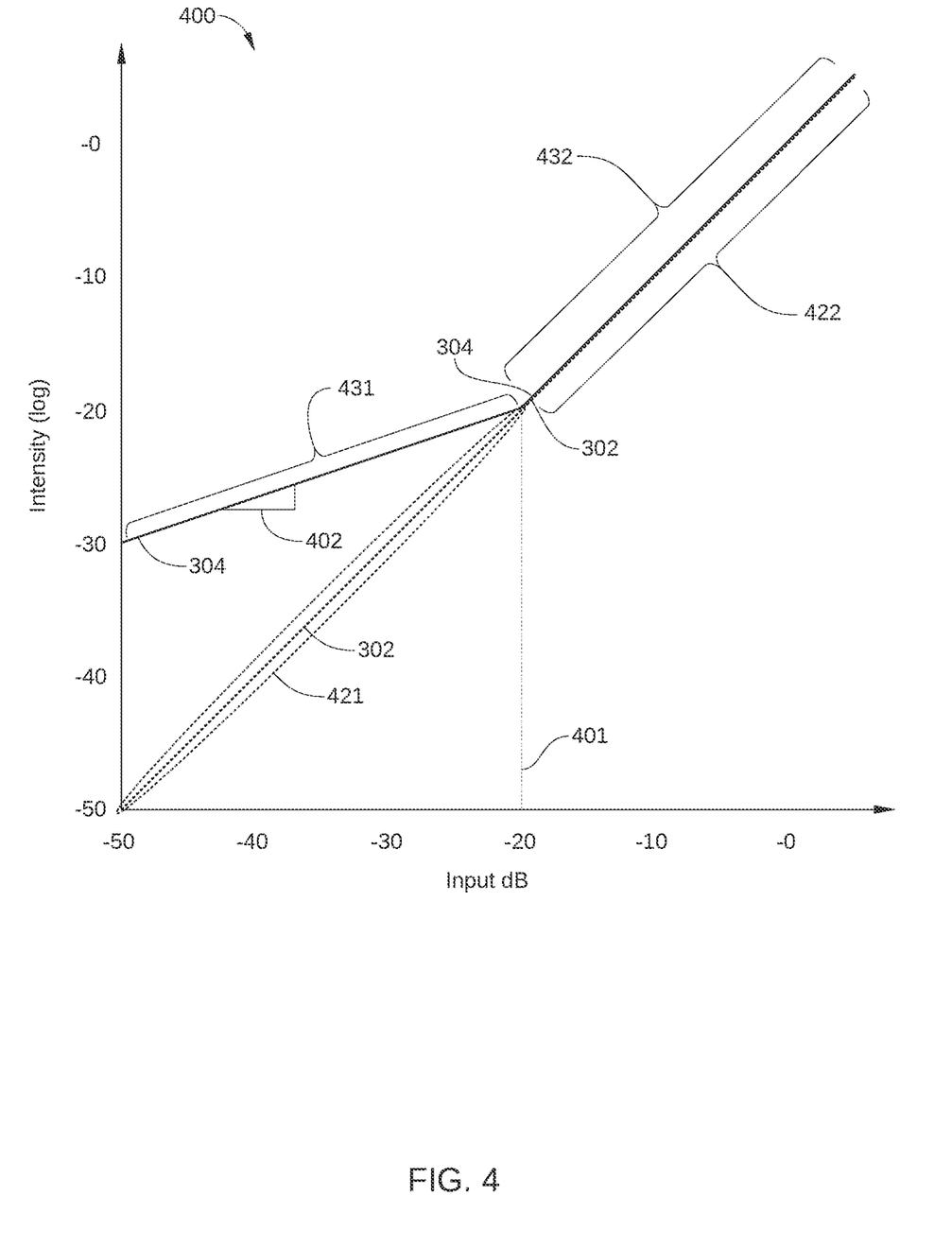
FIG. 4 illustrates a gain transfer plot for an upwards compression module, according to the one or more embodiments of the present disclosure.

FIG. 4 illustrates a gain transfer plot 400 for upwards compression module 330, according to the one or more embodiments of the present disclosure. Gain transfer plot 400 depicts changes in the magnitude of sound output levels of a signal (e.g., artificially reverberated signal 302) processed by upwards compression module 330. Thus, gain transfer plot 400 is a graph of compressed artificial reverberation signal 304 (solid line), with input levels on the horizontal axis and output levels on the vertical axis. For reference, gain transfer plot 400 also depicts the magnitude of the sound output levels of artificially reverberated signal 302 (dashed line) when not compressed, i.e., if upwards compression module 330 does not process artificially reverberated signal 302.

Artificially reverberated signal 302 includes a low output-level portion 421 having output levels that are below a compression threshold level 401 and a high output-level portion 422 having output levels that are above compression threshold level 401. As shown, the sound output levels of artificially reverberated signal 302 are depicted with a straight line, since in FIG. 4 artificially reverberated signal 302 is not compressed. That is, the various sound output levels of artificially reverberated signal 302 remain unchanged.

Similar to artificially reverberated signal 302, compressed artificial reverberation signal 304 includes a low output-level portion 431 having output levels that are below compression threshold level 401 and a high output-level portion 432 having output levels that are above compression threshold level 401. Unlike artificially reverberated signal 302, compressed artificial reverberation signal 304 is not depicted as a single straight line, because compressed artificial reverberation signal 304 has been compressed, and therefore the sound levels of low output-level portion 431 have been increased above the sound levels of low output-level portion 421. That is, the output levels of low output-level portion 431 are increased relative to the output levels of low output-level portion 421. Consequently, when compressed artificial reverberation signal 304 is combined with source signal 301 to form output signal 203, as shown in FIG. 3, the playback of output signal 203 in listening space 200 generates an audio signal 211 in which most or all of compressed artificial reverberation signal 304 is not masked by audio noise signal 213. Therefore, artificial reverberation included in audio signal 211 is audible to listener 204, who then perceives the acoustics of the synthetic room associated with artificially reverberated signal 302.

In the embodiment illustrated in FIG. 4, the sound levels of low output-level portion 431 are shown to be greater than the sound levels of low output-level portion 421 by a ratio of upwards compression module 330, which is depicted as a slope 402. In other embodiments, upwards compression module 330 is configured to increase the sound levels of low output-level portion 431 relative to low output-level portion 421 by any technically feasible sound-level quantity. The sound levels of high output-level portion 432 of compressed artificial reverberation signal 304 are above compression threshold level 401, and therefore are not compressed. As a result, the sound levels of high output-level portion 432 remain constant and, like high output-level portion 422, are depicted as a straight line.

In general, upwards compression module 330 may be any technically feasible processing unit capable of executing instructions to enable the functionality described herein. In some embodiments, upwards compression module 330 is implemented as a general-purpose processor that can run a suitable software application, such as a CPU. In some embodiments, upwards compression module 330 is implemented as a dedicated processing unit, such as an ASIC, an FPGA, any other type of processing unit, or a combination of different processing units.

Returning to FIG. 3, noise dependent parameter generator 340 is configured to generate one or more noise-dependent parameters 303 for use by upwards compression module 330. Noise dependent parameter generator 340 generates the one or more noise-dependent parameters 303 (such as threshold, compression ratio, make-up gain, and the like) based on a current noise level associated with listening space 200. For example, in some embodiments, the current noise level of listening space 200 is based on a sound level signal 306 from one or more of microphones 202 in listening space 200. Alternatively or additionally, in some embodiments, the current noise level is based on a current speed of a vehicle in which listening space 200 is disposed. Alternatively or additionally, in some embodiments, the current noise level is based on a current state of a device that generates noise within listening space 200. Thus, instead of a direct measurement of one or more audio noise signals 213 in listening space 200, sound level signal 306 may include an indicator of a state of each device that generates noise within listening space 200, such as a fan speed, an engine rotations-per-minute value, a current vehicle speed, and the like.

In some embodiments, noise dependent parameter generator 340 is further configured to determine a target value for compression threshold level 401 in FIG. 4 based on sound level signal 306. Alternatively, in some embodiments, upwards compression module 330 is configured to determine the target value for compression threshold level 401 based on sound level signal 306 or some other noise indicator included in noise-dependent parameters 303. In either case, as the current noise level associated with listening space 200 changes, compression threshold level 401 can be increased or decreased accordingly.

In general, dependent parameter generator 340 is further may be any technically feasible processing unit capable of executing instructions to enable the functionality described herein. In some embodiments, dependent parameter generator 340 is further is implemented as a general-purpose processor that can run a suitable software application, such as a CPU. In some embodiments, dependent parameter generator 340 is further is implemented as a dedicated processing unit, such as an ASIC, an FPGA, any other type of processing unit, or a combination of different processing units.

Signal combiner 350 combines source signal 301 and compressed artificial reverberation signal 304 to form output signal 203. One embodiment of output signal 203 is described below in conjunction with FIG. 5.

Figure 5:
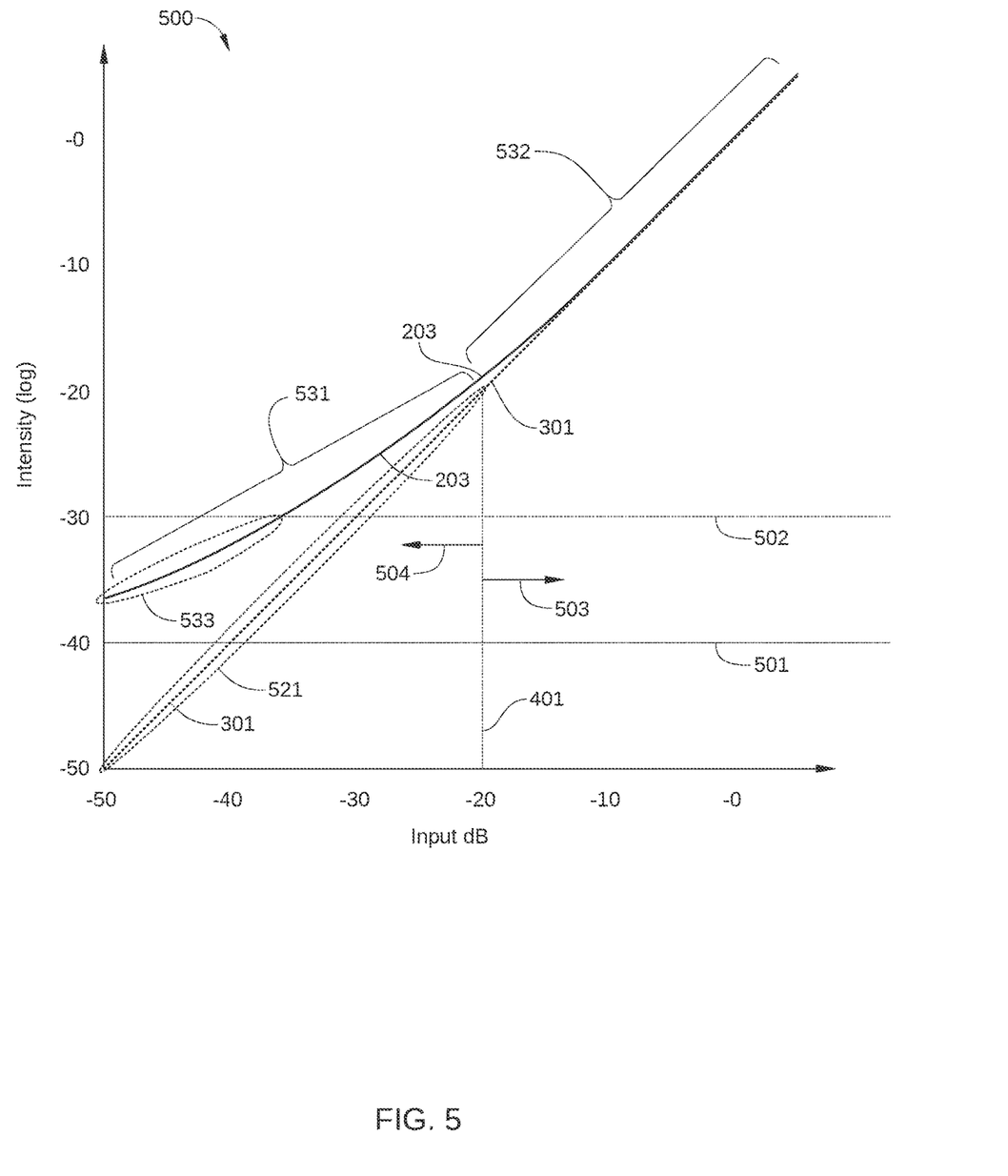
FIG. 5 illustrates a gain transfer plot for a sound reinforcement system, according to the one or more embodiments of the present disclosure.

FIG. 5 illustrates a gain transfer plot 500 for sound reinforcement system 220, according to one or more embodiments of the present disclosure. Gain transfer plot 500 depicts changes in the magnitude of sound output levels of a signal (e.g., source signal 301) processed by sound reinforcement system 220. Thus, gain transfer plot 500 is a graph of output signal 203 (solid line), with input levels on the horizontal axis and output levels on the vertical axis. For reference, gain transfer plot 500 also depicts the magnitude of the sound output levels of source signal 301 (dashed line) when not compressed, i.e., when sound reinforcement system 220 does not process source signal 301.

As shown, the sound output levels of source signal 301 are depicted with a straight line, since in FIG. 5 source signal 301 is not compressed. That is, the various sound output levels of source signal 301 remain constant.

Output signal 203 includes a low output-level portion 531 having output levels that are below compression threshold level 401 and a high output-level portion 532 having output levels that are above compression threshold level 401. As described above, output signal 203 includes the combination of source signal 301 and compressed artificial reverberation signal 304. Because the sound levels of compressed artificial reverberation signal 304 that are below compression threshold level 401 have been compressed upward, the sound levels of low output-level portion 531 have been increased above the sound levels of low output-level portion 521. That is, the output levels of low output-level portion 531 are increased relative to the output levels of low output-level portion 521 of source signal 301.

In FIG. 5, a first noise level 501 and a second noise level 502 are also shown. First noise level 501 and second noise level 502 indicate sound output levels below which signals are masked. For example, in one instance, first noise level 501 can correspond to a currently measured noise level of audio noise signal 213 (shown in FIG. 2). As described above, the upward compression of the output levels of a portion of output signal 203 increases the sound levels of output signal 203, especially in low output-level portion 531. Therefore, in the embodiment illustrated in FIG. 5, most or all of the late reverberations included in output signal 203 are audible to listener 204 when the currently measured noise level of audio noise signal 213 corresponds to first noise level 501. Consequently, the playback of output signal 203 in listening space 200 (see FIG. 2) generates an audio signal 211 in which most or all of artificially reverberated signal 302 is not masked by audio noise signal 213. Therefore, artificial reverberation included in audio signal 211 is audible to listener 204, who then perceives the acoustics of the synthetic room associated with artificially reverberated signal 302.

However, in an instance in which the currently measured noise level of audio noise signal 213 corresponds to second noise level 502, a significant portion of low output-level portion 531 of output signal 203 is masked. Specifically, some or all of a late reverberation portion 533 of output signal 203 is masked by audio noise signal 213. That is, the portion of output signal 203 that includes late reverberations from artificially reverberated signal 302 are likely to be inaudible to listener 204, which is highly undesirable. In such an instance, one or more noise-dependent parameters 303 are modified to increase compression of artificially reverberated signal 302 when compressed artificial reverberation signal 304 is generated by upwards compression module 330. For example, compression threshold level 401 can be increased (as indicated by arrow 503) and/or a ratio of upwards compression module 330 can be increased, among others. In this way, some or all of the sound levels of low output-level portion 531 are increased above second noise level 502. Conversely, in an instance in which the currently measured noise level of audio noise signal 213 approaches zero, compression threshold level 401 can be significantly reduced (as indicated by arrow 504). In such an instance, little or none of the sound levels of artificially reverberated signal 302 are compressed upwards.

In practice, implementation of a physical device capable of the performance of upwards compression module 330 can be problematic. That is, an upwards compression module that can leave the sound levels of high output-level portion 432 (shown in FIG. 4) unaffected while increasing the sound levels of low output-level portion 431 (shown in FIG. 4) as a function of a specified compression ratio can be difficult to realize. Consequently, in some embodiments, sound reinforcement system 220 employs a parallel compression scheme to increase the sound levels of an artificial reverberation signal, such as artificially reverberated signal 302. One such embodiment is described below in conjunction with FIG. 6.

Figure 6:
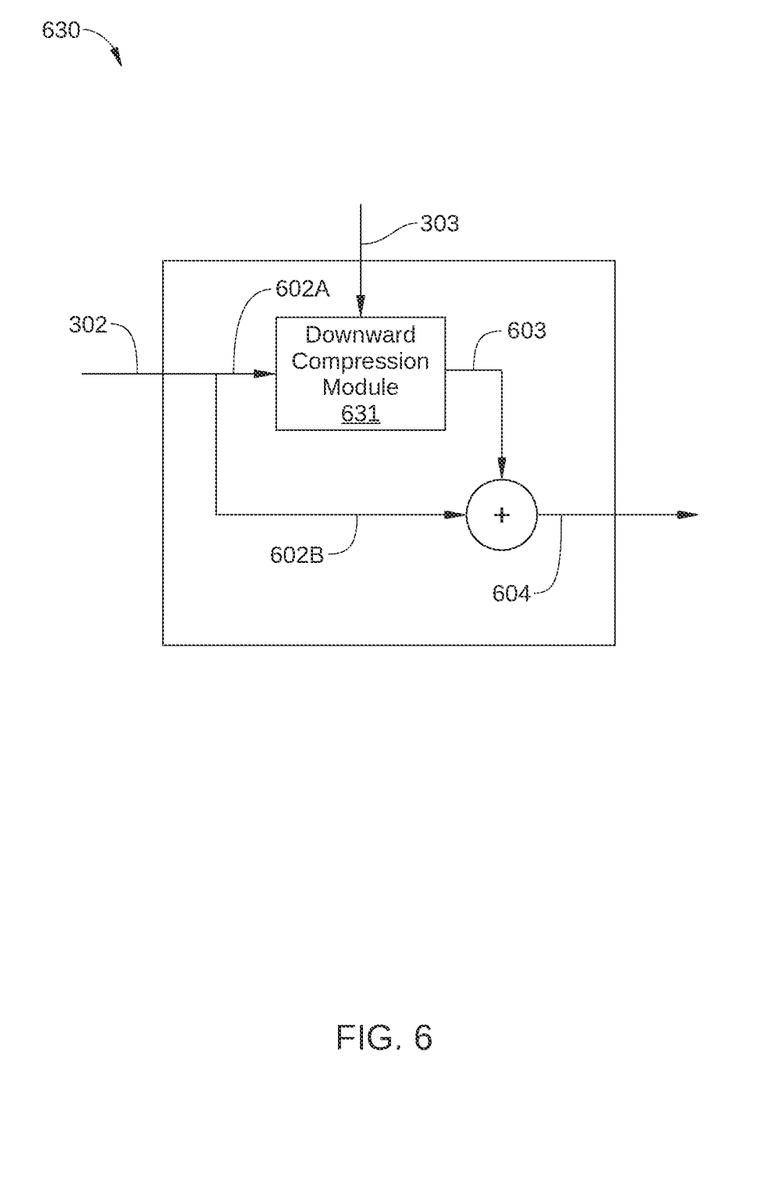
FIG. 6 is a block diagram of a parallel compression module that can be employed in lieu of upwards compression module, according to an embodiment of the present disclosure.

FIG. 6 is a block diagram of a parallel compression module 630 that can be employed in lieu of upwards compression module 330, according to an embodiment of the present disclosure. Parallel compression module 630 receives artificially reverberated signal 302 and one or more noise-dependent parameters 303, and generates a parallel-compressed artificial reverberation signal 604 via a downward compressor module 631. As shown, parallel compression module 630 splits artificially reverberated signal 302 into a treated artificial reverberation signal 602A and an untreated artificial reverberation signal 602B. Treated artificial reverberation signal 602A then undergoes a conventional downward compression process by downward compressor module 631 to produce a downward-compressed artificial reverberation signal 603.

In the conventional downward compression process, the sound levels in a high output-level portion of treated artificial reverberation signal 602A (such as a portion similar to high output-level portion 432 of FIG. 4) are reduced as a function of a compression ratio of downward compression module 631, while the sound levels in a low output-level portion of treated artificial reverberation signal 602A (such as a portion similar to low output-level portion 431 of FIG. 4) are not affected. Summing of untreated artificial reverberation signal 602B and downward-compressed artificial reverberation signal 603 then produces parallel-compressed artificial reverberation signal 604. One embodiment of a parallel-compressed artificial reverberation signal 604 is illustrated in FIG. 7.

Figure 7:
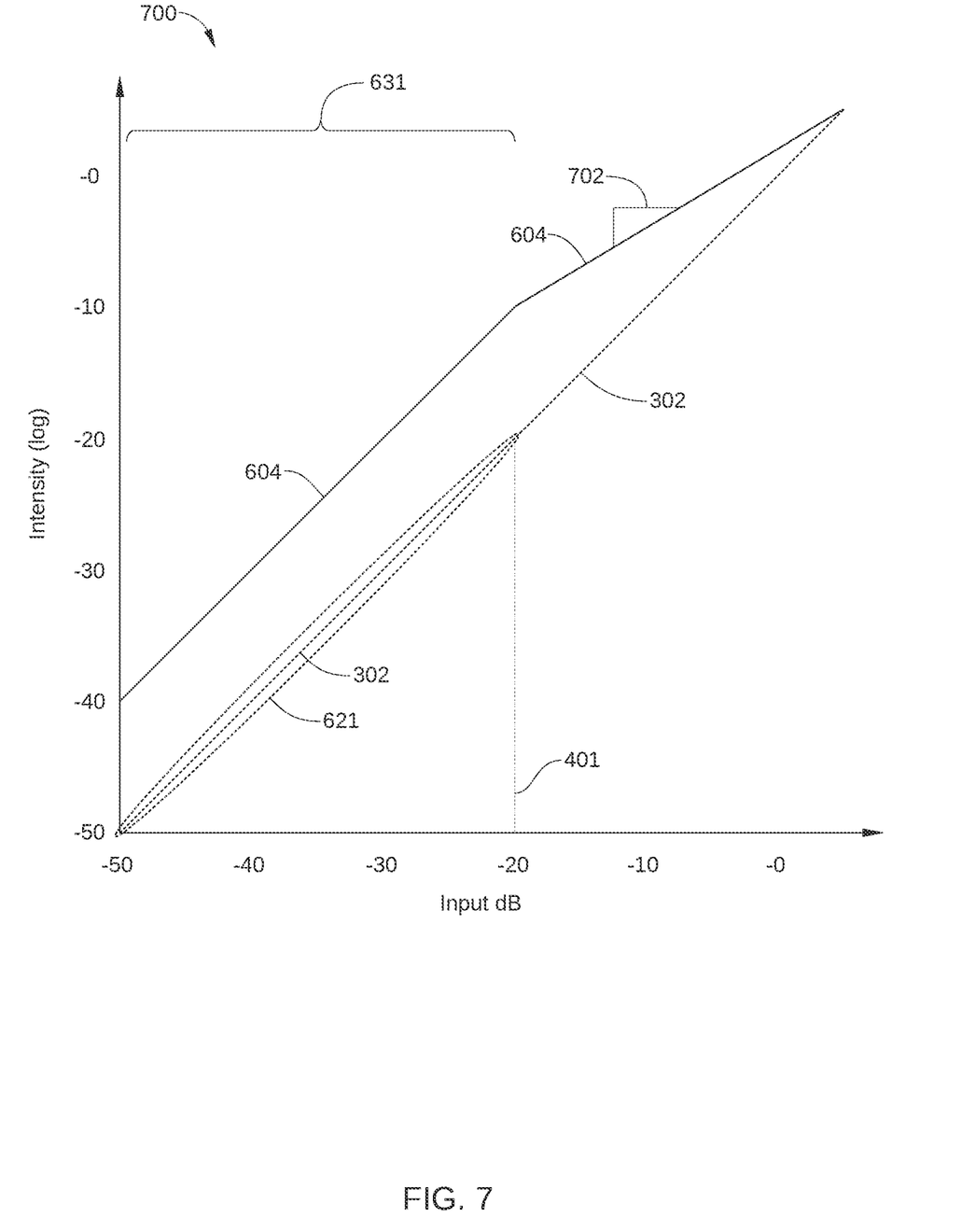
FIG. 7 illustrates a gain transfer plot for the parallel compression module of FIG. 6, according to the one or more embodiments of the present disclosure.

FIG. 7 illustrates a gain transfer plot 700 for parallel compression module 630, according to the one or more embodiments of the present disclosure. Gain transfer plot 700 depicts changes in the magnitude of sound output levels of a signal (e.g., artificially reverberated signal 302) processed by parallel compression module 630. Thus, gain transfer plot 700 is a graph of parallel-compressed artificial reverberation signal 604 (solid line), with input levels on the horizontal axis and output levels on the vertical axis. For reference, gain transfer plot 700 also depicts the magnitude of the sound output levels of artificially reverberated signal 302 (dashed line) when not compressed, i.e., if parallel compression module 630 does not process artificially reverberated signal 302. Parallel-compressed artificial reverberation signal 604 includes the sum of untreated artificial reverberation signal 602B (which is equivalent to artificially reverberated signal 302) and treated artificial reverberation signal 602A. The sound levels in the high output-level portion of treated artificial reverberation signal 602A are reduced (via normal downward compression), for example as a function of a compression ratio 702 of downward compression module 631. By contrast, the sound levels in the low output-level portion of treated artificial reverberation signal 602A remain unchanged. As a result, the sound levels of parallel-compressed artificial reverberation signal 604 are as shown and not a straight line vertically offset from artificially reverberated signal 302.

The summing of treated artificial reverberation signal 602A and untreated artificial reverberation signal 602B results in the sound levels in a low output-level portion 621 that are greater than the sound levels in a low output-level portion 621 of artificially reverberated signal 302. It is noted that this result is similar to the effect of upwards compression on artificially reverberated signal 302 as described above in conjunction with FIG. 4.

Figure 8:
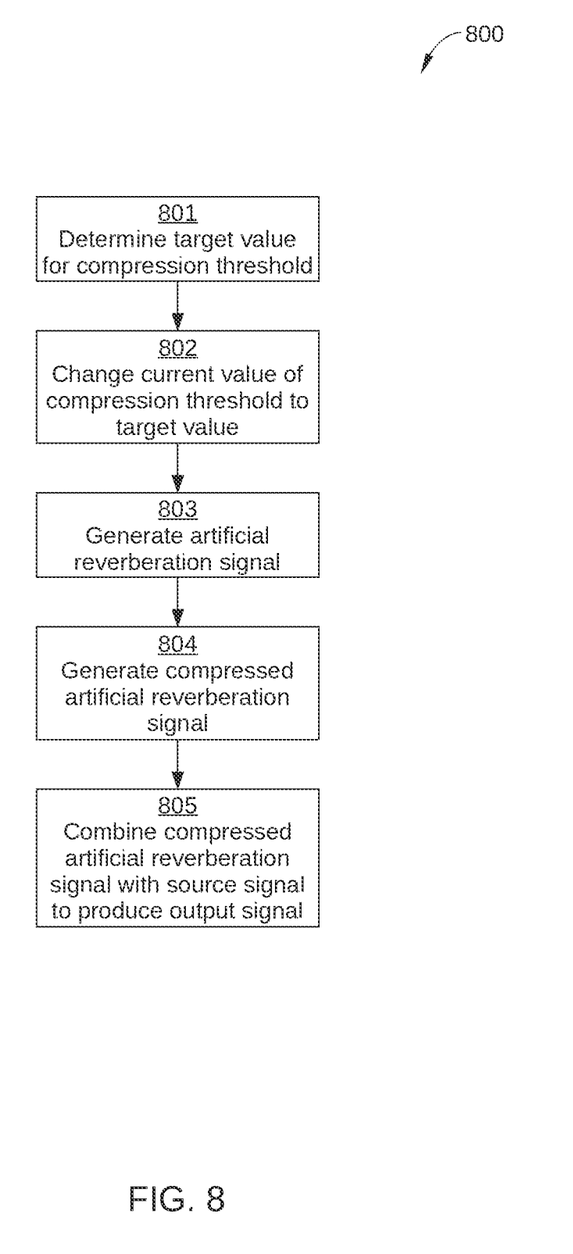
FIG. 8 is a flowchart of method steps for signal compression, according to various embodiments of the present disclosure.

FIG. 8 is a flowchart of method steps for signal compression, according to various embodiments of the present disclosure. Although the method steps are described with respect to the systems of FIGS. 1-7, persons skilled in the art will understand that any system configured to perform the method steps, in any order, falls within the scope of the various embodiments.

As shown, a method 800 begins at step 801, in which sound reinforcement system 220 determines a target value for compression threshold level 401. For example, in some embodiments, noise dependent parameter generator 340 makes such a determination based on a current noise level associated with listening space 200. As noted above, the current noise level can be based on a signal from microphone 202 in listening space 200, on a current speed of a vehicle in which listening space 200 is disposed, on a current state of a device that generates noise within listening space 200, etc. Additionally or alternatively, in some embodiments, sound reinforcement system 220 determines a target value for one or more compression parameters for compressing an artificial reverberation signal, such as a compression ratio, a make-up gain level, and the like.

In step 802, in response to determining the target value for compression threshold level 401, sound reinforcement system 220 changes a current value for compression threshold level 401 to the target value. Thus, when a current noise level is determined to increase, the current value for compression threshold level 401 also increases. Additionally or alternatively, in some embodiments, in response to determining the target value for one or more compression parameters, sound reinforcement system 220 changes current value(s) for the one or more compression parameters to the target value(s).

In step 803, sound reinforcement system 220 generates artificially reverberated signal 302 based on source signal 301 and an impulse response of listening space 200.

In step 804, sound reinforcement system 220 generates a compressed artificial reverberation signal, i.e., either upwards compressed artificial reverberation signal 304 or parallel-compressed artificial reverberation signal 604, depending on the configuration of sound reinforcement system 220.

In step 805, sound reinforcement system 220 combines the compressed artificial reverberation signal generated in step 804 with source signal 301 to form output signal 203 for listening space 200. When output signal 203 is played back by loudspeaker 201, an audio signal 211 is produced that includes audible artificial reverberation based on artificially reverberated signal 302.

In sum, various embodiments set forth systems and techniques for enhancing artificial reverberation in a noisy listening space via noise-dependent compression. In the embodiments, a compressor module compresses an artificial reverberation portion of an output signal, so that the artificial late reverberations that are designed to improve the listening experience in the listening space are increased in output level. An upward compression scheme or a parallel compression scheme can be employed to increase the sound levels associated with the artificial late reverberations. Further, compression parameters for the compressor module are modified based on a current noise level that is determined to be present in the listening space.

At least one technological improvement of the disclosed embodiments is that a listener in a listening space can have an acoustical experience of being in an another room. For example, a listener in an acoustically dry listening space can have an acoustical experience akin to sitting in a concert hall or other widened listening space, even in the presence of significant noise that would normally mask artificial reverberation.

1. In some embodiments, a method of signal compression comprises generating an artificial reverberation signal based on a source signal and a response of a listening space, wherein the artificial reverberation signal includes a first low output-level portion having output levels that are below a compression threshold level and a first high output-level portion having output levels that are above the compression threshold level; generating a compressed artificial reverberation signal by increasing the output levels of the low output-level portion by a first magnitude and increasing the output levels of the high output-level portion by less than the first magnitude; and combining the compressed artificial reverberation signal with the source signal to form an output signal for the listening space.

2. The method of clause 1, further comprising based on a current noise level associated with the listening space, determining a target value for the compression threshold level; and changing a current value for the compression threshold level to the target value.

3. The method of clauses 1 or 2, further comprising determining the current noise level based on a signal from a microphone disposed in the listening space.

4. The method of any of clauses 1-3, further comprising determining the current noise level based on a current speed of a vehicle in which the listening space is disposed.

5. The method of any of clauses 1-4, further comprising determining the current noise level based on a current state of a device that generates noise within the listening space.

6. The method of any of clauses 1-5, wherein the listening space is disposed within a vehicle.

7. The method of any of clauses 1-6, further comprising: based on a current noise level associated with the listening space, determining a target value for a compression parameter for generating the compressed artificial reverberation signal; and changing a current value for the compression parameter to the target value.

8. The method of any of clauses 1-7, wherein generating the compressed artificial reverberation signal comprises modifying the artificial reverberation signal with an upward compression scheme.

9. The method of any of clauses 1-8, wherein modifying the artificial reverberation signal with an upward compression scheme comprises: generating the output levels of the second low output-level portion based on the output levels of the first low output-level portion; and setting the output levels of the second high-output level portion equal to the output levels of the first high-output level portion.

10. The method of any of clauses 1-9, wherein modifying the artificial reverberation signal with an upward compression scheme comprises generating the output levels of the second low output-level portion based on increasing the output levels of the first low output-level portion by a ratio of the upward compression scheme.

11. In some embodiments, a system comprises: a sensor configured to generate a signal indicating a current noise level in a listening space; a loudspeaker configured to output sound in the listening space based on an output signal; and at least one processor configured to execute instructions to: generate an artificial reverberation signal based on a source signal and a response of a listening space, wherein the artificial reverberation signal includes a first low output-level portion having output levels that are below a compression threshold level and a first high output-level portion having output levels that are above the compression threshold level; generate a compressed artificial reverberation signal based on the artificial reverberation signal by increasing the output levels of the low output-level portion by a first magnitude and increasing the output levels of the high output-level portion by less than the first magnitude; and combine the compressed artificial reverberation signal with the source signal to form an output signal for the listening space.

12. The system of clause 11, wherein generating the compressed artificial reverberation signal comprises modifying the artificial reverberation signal with a parallel compression scheme.

13. The system of clauses 11 or 12, wherein modifying the artificial reverberation signal with a parallel compression scheme comprises: generating a treated artificial reverberation signal by compressing the artificial reverberation signal with a downward compression scheme; and generating a parallel-compressed artificial reverberation signal by summing the treated artificial reverberation signal with the artificial reverberation signal.

14. The system of any of clauses 11-13, further comprising: based on a current noise level associated with the listening space, determining a target value for the compression threshold level; and changing a current value for the compression threshold level to the target value.

15. The system of any of clauses 11-14, further comprising determining the current noise level based on a signal from a microphone disposed in the listening space.

16. The system of any of clauses 11-15, further comprising determining the current noise level based on a current speed of a vehicle in which the listening space is disposed.

17. The system of any of clauses 11-16, further comprising determining the current noise level based on a current state of a device that generates noise within the listening space.

18. The system of any of clauses 11-17, wherein the listening space is disposed within a vehicle.

19. In some embodiments, a non-transitory computer-readable storage medium includes instructions that, when executed by at least one processor, configure the at least one processor to perform the steps of: generating an artificial reverberation signal based on a source signal and a response of a listening space, wherein the artificial reverberation signal includes a first low output-level portion having output levels that are below a compression threshold level and a first high output-level portion having output levels that are above the compression threshold level; generating a compressed artificial reverberation signal by increasing the output levels of the low output-level portion by a first magnitude and increasing the output levels of the high output-level portion by less than the first magnitude; and combining the compressed artificial reverberation signal with the source signal to form an output signal for the listening space.

20. The non-transitory computer-readable storage medium of clause 19, further including instructions that, when executed by at least one processor, configure the at least one processor to perform the steps of: based on a current noise level associated with the listening space, determining a target value for the compression threshold level; and changing a current value for the compression threshold level to the target value.

Any and all combinations of any of the claim elements recited in any of the claims and/or any elements described in this application, in any fashion, fall within the contemplated scope of the present embodiments and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in at least one computer readable medium having computer readable program code embodied thereon.

Any combination of at least one computer readable medium may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RANI), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises at least one executable instruction for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method of regenerating reverberation, the method comprising:
    generating a reverberation signal based on a source signal and a response of a listening space;
    generating a compressed reverberation signal by increasing output levels of a first portion of the reverberation signal having output levels below a threshold level more than output levels of a second portion of the reverberation signal having output levels above the threshold level; and
    combining the compressed reverberation signal with the source signal to form an output signal for the listening space.

2. The method of claim 1, further comprising determining the threshold level based on a current noise level associated with the listening space.

3. The method of claim 2, further comprising determining the current noise level based on a signal from a microphone disposed in the listening space.

4. The method of claim 2, further comprising determining the current noise level based on a current speed of a vehicle in which the listening space is disposed.

5. The method of claim 2, further comprising determining the current noise level based on a current state of a device that generates noise within the listening space.

6. The method of claim 1, wherein the listening space is disposed within a vehicle.

7. The method of claim 1, wherein the response of the listening space comprises an acoustical response of the listening space to an impulse.

8. The method of claim 1, further comprising determining a compressing parameter for generating the compressed reverberation signal based on a current noise level associated with the listening space.

9. The method of claim 1, wherein generating the compressed reverberation signal comprises modifying the reverberation signal with an upward compression scheme.

10. The method of claim 9, wherein modifying the reverberation signal with the upward compression scheme comprises:
generating output levels of a third portion of the reverberation signal having output levels below the threshold level based on the output levels of the first portion of the reverberation signal; and
setting output levels of a fourth portion of the reverberation signal having output levels above the threshold level based on the output levels of the second portion of the reverberation signal.

11. The method of claim 9, wherein modifying the reverberation signal with the upward compression scheme comprises generating output levels of the first portion of the reverberation signal based on increasing the output levels of the first portion of the reverberation signal by a ratio of the upward compression scheme.

12. One or more non-transitory computer-readable storage media including instructions that, when executed by one or more processors, configure the one or more processors to perform the steps of:
generating a reverberation signal based on a source signal and a response of a listening space;
generating a compressed reverberation signal by increasing output levels of a first portion of the reverberation signal having output levels below a threshold level more than output levels of a second portion of the reverberation signal having output levels above the threshold level; and
combining the compressed reverberation signal with the source signal to form an output signal for the listening space.

13. The one or more non-transitory computer-readable storage media of claim 12, wherein the steps further comprise determining the threshold level based on a current noise level associated with the listening space.

14. The one or more non-transitory computer-readable storage media of claim 13, wherein the steps further comprise determining the current noise level based on at least one of a signal from a microphone disposed in the listening space, a current speed of a vehicle in which the listening space is disposed, or a current state of a device that generates noise within the listening space.

15. The one or more non-transitory computer-readable storage media of claim 12, wherein generating the compressed reverberation signal comprises modifying the reverberation signal with a parallel compression scheme.

16. The one or more non-transitory computer-readable storage media of claim 15, wherein modifying the reverberation signal with the parallel compression scheme comprises:
generating a treated reverberation signal by compressing the reverberation signal with a downward compression scheme; and
generating a parallel-compressed reverberation signal by summing the treated reverberation signal with the reverberation signal.

17. The one or more non-transitory computer-readable storage media of claim 12, wherein generating the compressed reverberation signal comprises modifying the reverberation signal based on a gain transfer relationship.

18. The one or more non-transitory computer-readable storage media of claim 12, wherein the listening space is disposed within a vehicle.

19. A system, comprising:
a loudspeaker; and
at least one processor configured to execute instructions to:
generate a reverberation signal based on a source signal and a response of a listening space;
generate a compressed reverberation signal based on the reverberation signal increasing output levels of a first portion of the reverberation signal having output levels below a threshold level more than output levels of a second portion of the reverberation signal having output levels above the threshold level;
combine the compressed reverberation signal with the source signal to form an output signal; and
play back the output signal on the loudspeaker.

20. The system of claim 19, wherein the at least one processor is further configured to execute instructions to determine the threshold level based on a current noise level associated with the listening space.

* * * * *